United States Patent  
Alsmeier et al.

(10) Patent No.: US 9,449,984 B2
(45) Date of Patent: *Sep. 20, 2016

(54) VERTICAL NAND DEVICE WITH LOW CAPACITANCE AND SILICIDED WORD LINES

(71) Applicant: SANDISK TECHNOLOGIES, INC., Plano, TX (US)

(72) Inventors: Johann Alsmeier, San Jose, CA (US); Peter Rabkin, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/465,099

(22) Filed: Aug. 21, 2014

(65) Prior Publication Data

US 2014/0361360 A1 Dec. 11, 2014

Related U.S. Application Data

(63) Continuation of application No. 13/443,287, filed on Apr. 10, 2012, now Pat. No. 8,847,302.

(51) Int. Cl.
*H01L 29/66* (2006.01)
*H01L 27/115* (2006.01)
(Continued)

(52) U.S. Cl.
CPC ... *H01L 27/11582* (2013.01); *H01L 21/28282* (2013.01); *H01L 21/764* (2013.01);
(Continued)

(58) Field of Classification Search
CPC .................................... H01L 27/11524
USPC ....................... 257/331, 316, 390
See application file for complete search history.

(56) References Cited

U.S. PATENT DOCUMENTS 7,005,350 B2 2/2006 Walker et al.
7,023,739 B2 4/2006 Chen et al.
(Continued)

FOREIGN PATENT DOCUMENTS

CN 0N102237314 A 11/2011
WO WO02/15277 A2 2/2002
WO WO2011/104782 A1 9/2011

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Phat X Cao
*Assistant Examiner* — Mohammad M Hoque
(74) *Attorney, Agent, or Firm* — The Marbury Law Group PLLC

(57) ABSTRACT

A three dimensional memory device including a substrate and a semiconductor channel. At least one end portion of the semiconductor channel extends substantially perpendicular to a major surface of the substrate. The device also includes at least one charge storage region located adjacent to semiconductor channel and a plurality of control gate electrodes having a strip shape extending substantially parallel to the major surface of the substrate. The plurality of control gate electrodes include at least a first control gate electrode located in a first device level and a second control gate electrode located in a second device level located over the major surface of the substrate and below the first device level. Each of the plurality of control gate electrodes includes a first edge surface which is substantially free of silicide, the first edge surface facing the semiconductor channel and the at least one charge storage region and a silicide located on remaining surfaces of the control gate electrode.

14 Claims, 3 Drawing Sheets

(51) Int. Cl.
*H01L 21/28* (2006.01)
*H01L 21/764* (2006.01)
*H01L 29/792* (2006.01)
*H01L 29/49* (2006.01)
*H01L 29/51* (2006.01)

(52) U.S. Cl.
CPC ......... *H01L29/4933* (2013.01); *H01L 29/512* (2013.01); *H01L 29/7926* (2013.01); *H01L 27/1157* (2013.01)

(56) References Cited

U.S. PATENT DOCUMENTS

| | | | |
|---|---|---|---|
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,258,033 | B2* | 9/2012 | Watanabe ......... H01L 27/11582 257/E21.423 |
| 8,278,170 | B2* | 10/2012 | Lee ................... H01L 27/11551 257/E21.645 |
| 8,394,716 | B2* | 3/2013 | Hwang ............. H01L 27/11551 257/315 |
| 8,445,347 | B2 | 5/2013 | Alsmeier |
| 8,786,003 | B2* | 7/2014 | Iwase ................. H01L 27/0738 257/316 |
| 8,791,523 | B2* | 7/2014 | Iino .................... H01L 27/1157 257/324 |
| 2007/0210338 | A1 | 9/2007 | Orlowski |
| 2007/0252201 | A1 | 11/2007 | Kito et al. |
| 2009/0242967 | A1* | 10/2009 | Katsumata ........... H01L 21/764 257/324 |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0148237 | A1* | 6/2010 | Kito .................. H01L 27/11551 257/315 |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0216597 | A1* | 9/2011 | Higashi ................. G11C 16/04 365/185.18 |
| 2011/0266606 | A1 | 11/2011 | Park et al. |
| 2011/0272755 | A1 | 11/2011 | Endo et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0001252 | A1 | 1/2012 | Alsmeier et al. |
| 2012/0012920 | A1 | 1/2012 | Shin et al. |
| 2012/0052674 | A1* | 3/2012 | Lee ................... H01L 27/11578 438/591 |
| 2012/0092926 | A1* | 4/2012 | Whang ............. H01L 27/11556 365/185.01 |
| 2012/0146122 | A1* | 6/2012 | Whang ............... H01L 29/7889 257/315 |
| 2012/0184097 | A1* | 7/2012 | Chen ................. H01L 27/11286 438/618 |
| 2012/0267699 | A1* | 10/2012 | Kiyotoshi ......... H01L 27/11524 257/319 |
| 2012/0280303 | A1* | 11/2012 | Kiyotoshi ......... H01L 27/11524 257/316 |
| 2013/0056816 | A1* | 3/2013 | Iwase ................. H01L 27/0738 257/316 |
| 2013/0083597 | A1 | 4/2013 | Nakamura et al. |
| 2013/0130495 | A1 | 5/2013 | Higashitani et al. |
| 2013/0264631 | A1 | 10/2013 | Alsmeier et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
International Search Report and Written Opinion, International Application No. PCT/US2013/035567, issued Sep. 30, 2013, 6pgs.
International Preliminary Report on Patentability received in connection with international application No. PCT/US2013/035567; mailed Oct. 23, 2014.
Chinese First Office Action for Patent Application No. 2013800150093, dated Apr. 15, 2016, 14 pages.

* cited by examiner

Fig. 3A
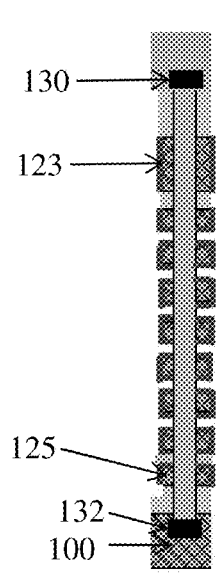
Fig. 3B
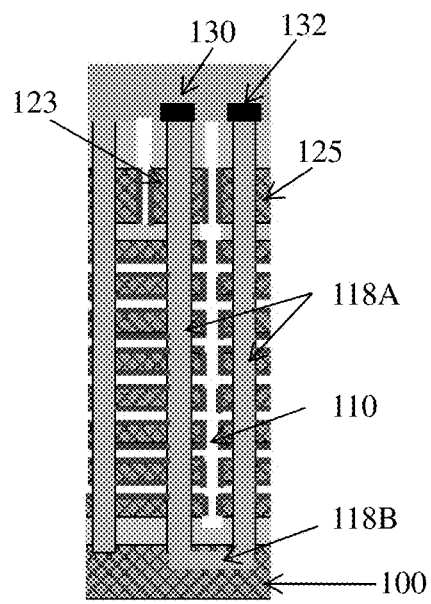
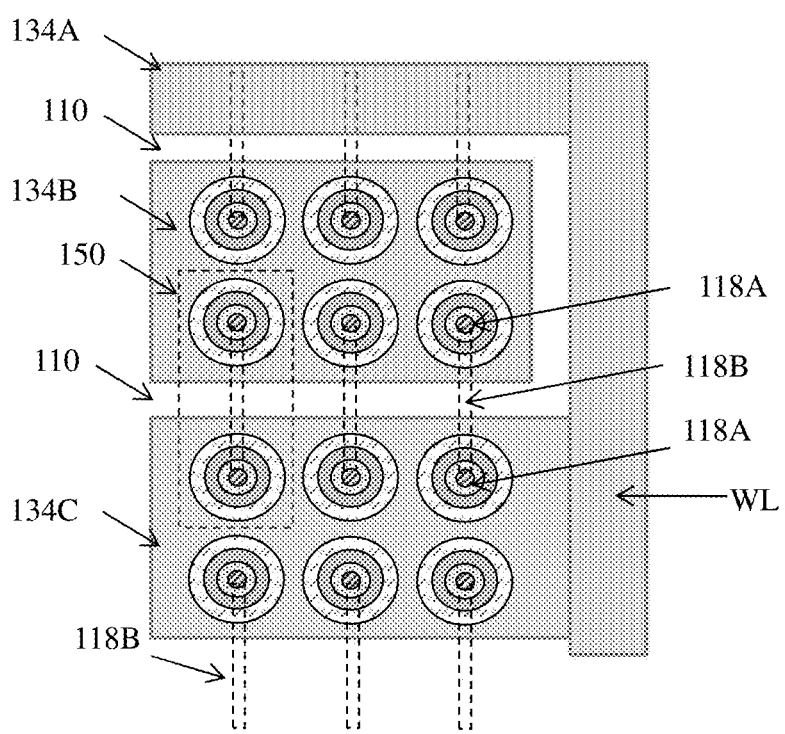
Fig. 4

US 9,449,984 B2

VERTICAL NAND DEVICE WITH LOW CAPACITANCE AND SILICIDED WORD LINES

RELATED APPLICATIONS

The instant application is a continuation application of U.S. application Ser. No. 13/443,287 filed on Apr. 12, 2012 and subsequently issued as U.S. Pat. No. 8,847,302 on Sep. 30, 2014.

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a three dimensional memory device including a substrate and a semiconductor channel. At least one end portion of the semiconductor channel extends substantially perpendicular to a major surface of the substrate. The device also includes at least one charge storage region located adjacent to semiconductor channel and a plurality of control gate electrodes having a strip shape extending substantially parallel to the major surface of the substrate. The plurality of control gate electrodes include at least a first control gate electrode located in a first device level and a second control gate electrode located in a second device level located over the major surface of the substrate and below the first device level. Each of the plurality of control gate electrodes includes a first edge surface which is substantially free of silicide, the first edge surface facing the semiconductor channel and the at least one charge storage region and a silicide located on remaining surfaces of the control gate electrode.

Another embodiment relates to a method of making a three dimensional memory device. The method includes providing a plurality of columns extending substantially perpendicular to a major surface of the substrate in which each column includes a core with a semiconductor channel, a first shell with a tunnel dielectric, a second shell with a charge storage material and a third shell with a blocking dielectric. Each column is surrounded by a stack of alternating layers of a first material and a second material over the major surface of the substrate. The first material includes a Group IV semiconductor control gate material. The second material includes a sacrificial material and the stack comprises at least one trench separating a first column from a second column. The method also includes removing the layers of sacrificial material to form air gaps between the layers of semiconductor control gate material and forming a silicide on surfaces of the layers of semiconductor control gate material exposed by removal of the sacrificial material.

BRIEF DESCRIPTION OF THE DRAWINGS

FIG. 3A is a side cross sectional view of a vertical NAND string according to an embodiment.

FIG. 3B is a side cross section of another vertical NAND string according to another embodiment.

FIG. 4 is a plan view of a memory device according to an embodiment.

DETAILED DESCRIPTION

Figure 1A:
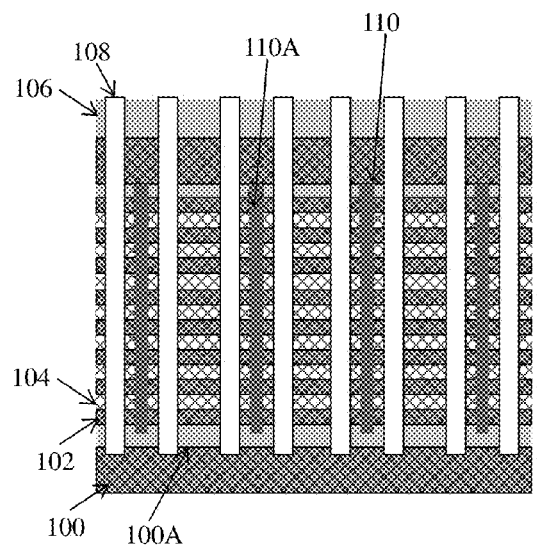
FIG. 1A is a schematic side cross sectional view illustrating a step in a method of making a three dimensional memory device according to an embodiment.

Embodiments include monolithic three dimensional NAND strings and methods of making three dimensional NAND strings. In an embodiment, the NAND string may be formed with a single vertical channel. In one aspect, the vertical channel has a solid, rod shape. In this aspect, the entire channel comprises a semiconductor material. In another aspect, the vertical channel has a hollow cylinder shape. In this aspect, the vertical channel includes a non-semiconductor core surrounded by a semiconductor channel shell. The core may be unfilled or filled with an insulating material, such as silicon oxide or silicon nitride. Alternatively, the NAND string may have a U shape (also known as a "pipe" shape) with two vertical channel wing portions connected with a horizontal channel connecting the wing portions. In one aspect, the U shaped or pipe shaped channel may be solid, as in the solid rod shaped vertical channel NAND. In another aspect, the U shaped or pipe shaped channel may be hollow cylinder shaped, as in the hollow cylinder pipe shaped vertical channel NAND. The U-shaped pipe channel may be filled or unfilled. Separate front side and back side methods for fabricating both single vertical channel and U shaped channel NAND strings are taught in co-pending U.S. patent application Ser. No. 12/827,947, hereby incorporated by reference in its entirety for teaching of the separate front and back side processing methods. Combination front side and back side methods for fabricating both single vertical channel and U shaped channel NAND strings are taught in co-pending U.S. patent application Ser. No. 13/083,775, hereby incorporated by reference in its entirety for teaching combination front side and back side processing methods.

Vertical channel, Bit Cost Scalable (BiCS) NAND memory and U-shaped (i.e., "pipe-shaped") BiCS (p-BiCS) were developed for ultra high density storage devices. However, earlier BiCS and p-BiCS 3D NAND architectures suffer from relatively high control gate/word line resistances and capacitances. These resistances and capacitances reduce cell efficiency and increase the power consumption of the memory device.

The inventors have discovered that modification of the BiCS and p-BiCS processes allows improved silicidation of the control gates/word lines. The silicidation of the control gates/word lines lowers the resistance of the control gates/word lines, resulting in a decrease in device power consumption and providing an increase in cell efficiency. Additional modification of the BiCS and p-BiCS processes to include air gaps between control gates/word lines in adjacent device levels (i.e., air gaps between vertically separated control gates) lowers the capacitance between the control gates/word lines. This also results in a decrease in device power consumption and increases the cell efficiency.

As used herein, the term "control gate" and "word line" refer to the same electrically conductive entity. A control gate may be considered a portion of a word line located adjacent to and controlling one NAND cell in an array of NAND cells. A word line controls plural NAND cells in the array. Thus, the word line may be considered to be a portion of the electrically conductive entity which connects the control gates. However, it should be understood that the word line and its control gate portions may be formed during the same step and may comprise the same one or more electrically conductive layers as will be described below.

FIGS. 1A-1F illustrate a method of making a three dimensional memory device (e.g., vertical NAND string) according to an embodiment of the invention. In this embodiment, a substrate 100 is provided with a stack of alternating layers of a first material layer 102 and a second material layer 104 formed over the major surface 100a of the substrate 100.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Layers 102 and 104 may be deposited over the substrate 100 by any suitable deposition method, such as sputtering, CVD, PECVD, MBE, etc. Preferably, the first material layer 102 is suitable for use as a control gate. Suitable materials include, but are not limited to, heavily doped Group IV semiconductors, such as silicon (e.g., polysilicon), silicon germanium, silicon carbide, etc. The semiconductor may be p-type or n-type doped and have a doping concentration between $10^{17}$ cm$^{-3}$ and $10^{21}$ cm$^{-3}$.

The second material layer 104 includes a sacrificial material. Any sacrificial material that may be selectively etched compared to the first material may be used. For example, if the first material layer 102 is p-doped polysilicon, the sacrificial materials 104 may be intrinsic polysilicon (i.e., doping below $10^{16}$ cm$^{-3}$). Alternatively, the second material layer 104 may comprise a metal or an insulating material (e.g., silicon oxide, silicon nitride, etc.) that may be selectively etched with respect to the first mater layer 102. The stack may be covered with a top layer of insulating material 106, such as silicon oxide or silicon nitride.

After deposition of the layers 102 and 104, the stack may be etched to form memory holes 108 and slit trenches 110. The slit trenches 110 may be filled with a sacrificial material 110A, such as silicon nitride or another material which can be selectively etched compared to materials of layer 102 and 104, while the memory cells are formed in the memory holes 108. For example, the slit trenches 110 may be formed first using lithography and etching, then the trenches 110 may be filled with the sacrificial material 110A, followed by formation of the memory holes 108 using another lithography and etching step.

Figure 1B:
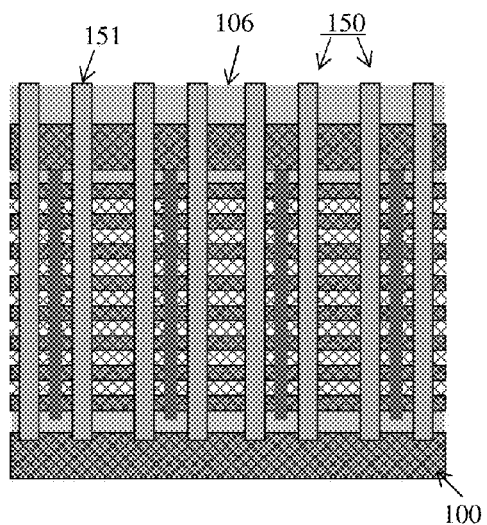
FIG. 1B is a schematic side cross sectional view illustrating another step in the method of making a three dimensional memory device according to an embodiment.

In an embodiment, the memory cells 150 (e.g., vertical NAND strings) may be formed with a series of conformal deposition steps of the memory film and channel column portions 151 of the memory cells 150 in the memory holes 108, as shown in FIG. 1B. Conformal deposition techniques include, but are not limited to, atomic layer deposition (ALD) and chemical vapor deposition (CVD).

Figure 2:
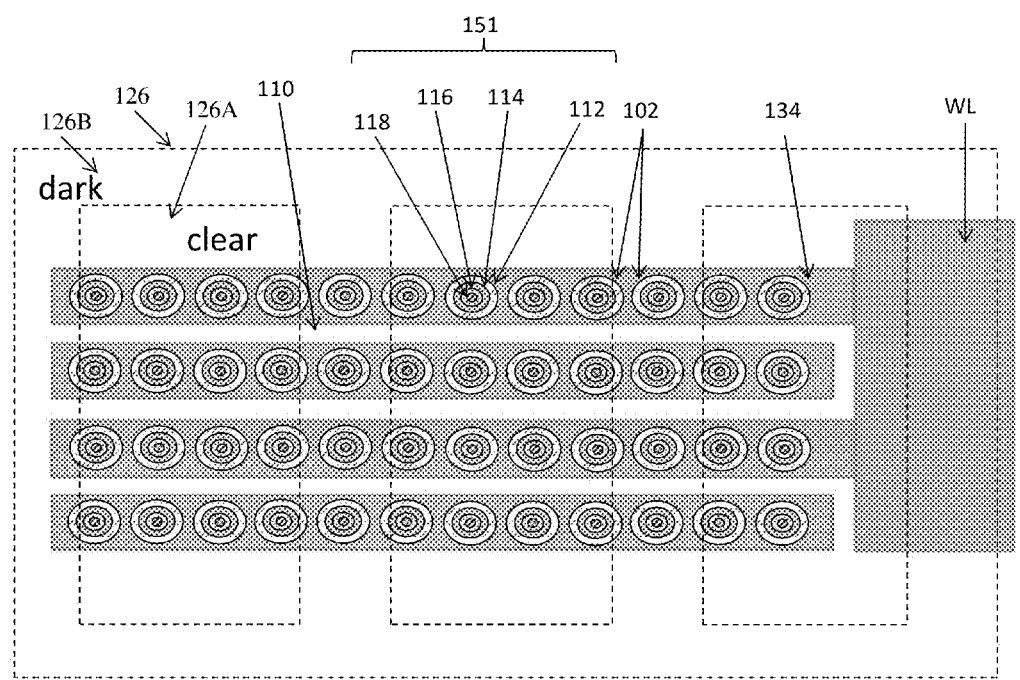
FIG. 2 is a plan view a memory device according to an embodiment. Also illustrated is a support mask layout used in the method of FIG. 1.

For example, as shown in FIG. 2, a layer of blocking dielectric 112 may first be conformally deposited in the memory holes 108. Next, a layer of charge storage material 114 may be conformally deposited on the layer of blocking dielectric 112 in the memory holes 108. A layer of tunnel dielectric 116 may then be conformally deposited on the charge storage material 114 in the memory holes 108. The central portion of the memory hole 108 may then be filled with a semiconductor channel material 118, such as polysilicon.

The channel 118 material may comprise lightly doped p-type or n-type (i.e., doping below $10^{17}$ cm$^{-3}$) semiconductor material (e.g., polysilicon). An n-channel device is preferred since it is easily connected with n+ junctions (i.e., source and drain n+ doped regions having a doping concentration between $10^{17}$ cm$^{-3}$ and $10^{21}$ cm$^{-3}$ located at the opposite ends of each channel). However, a p-channel device may also be used. Other semiconductor materials (e.g., SiGe, SiC, Ge, III-V, II-VI, etc.) may also be used.

The blocking dielectric 112 may comprise a silicon oxide layer deposited by conformal atomic layer deposition (ALD) or chemical vapor deposition (CVD). Other high-k dielectric materials, such as hafnium oxide, may be used instead or in addition to silicon oxide. Dielectric 112 may have a thickness of 6 to 20 nm. The charge storage region 114 may comprise a silicon nitride layer deposited by any suitable method, such as ALD, CVD, etc., and have a thickness of 2 to 20 nm. The tunnel dielectric 116 may comprise a relatively thin insulating layer (e.g., 4 to 10 nm thick) of silicon oxide or other suitable material, such as oxynitride, oxide and nitride multi layer stacks, or a high-k dielectric (e.g., hafnium oxide), deposited by any suitable method, such as ALD, CVD.

The result of the conformal depositions is formation of memory cell 150 columns 151 substantially perpendicular to the major surface of the substrate. Each memory cell column 151 includes a semiconductor channel core 118, a first shell of tunnel dielectric 116, a second shell of charge storage material 114 and a third shell of blocking dielectric 112. The blocking dielectric layer, the charge storage material (i.e., the charge trapping layer), and a tunnel dielectric layer extend substantially perpendicular to the major surface 110A of the substrate 100 between the semiconductor channel 118 and the plurality of control gate electrodes 102.

Figure 1C:
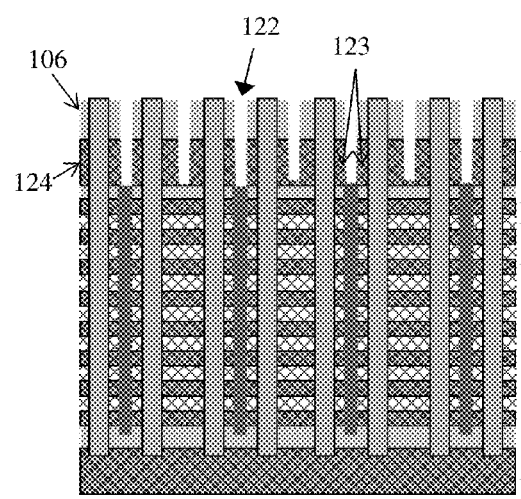
FIG. 1C is a schematic side cross sectional view illustrating another step in the method of making a three dimensional memory device according to an embodiment.
Figure 1D:
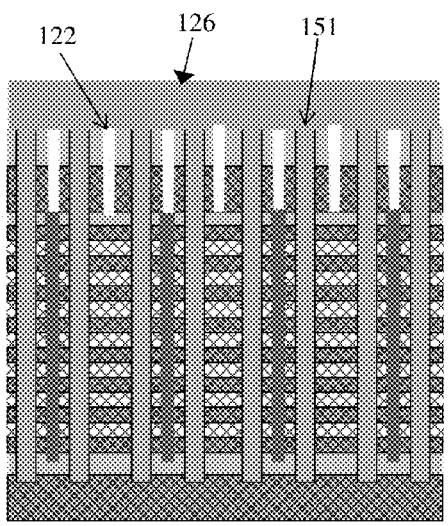
FIG. 1D is a schematic side cross sectional view illustrating another step in the method of making a three dimensional memory device according to an embodiment.
Figures 1E, 1F:
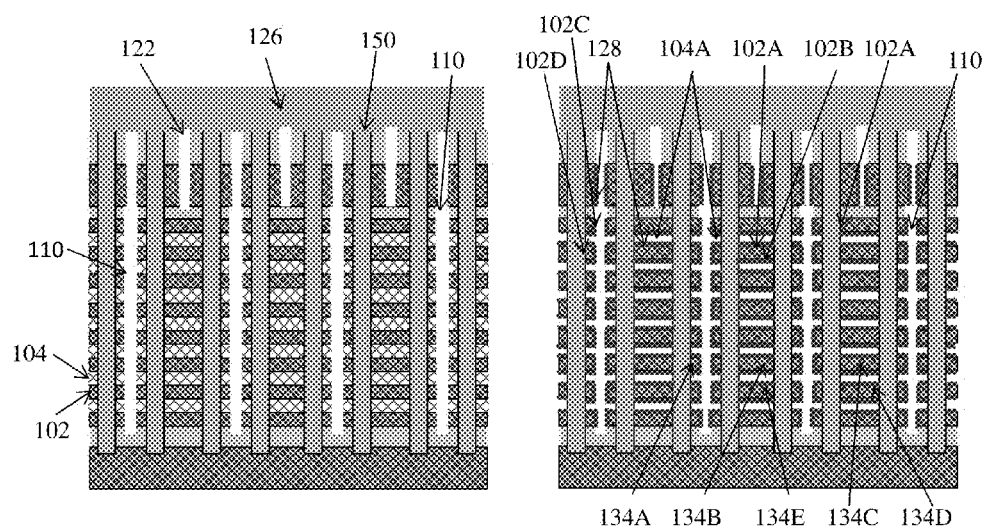
FIG. 1E is a schematic side cross sectional view illustrating another step in the method of making a three dimensional memory device according to an embodiment.
FIG. 1F is a schematic side cross sectional view illustrating another step in the method of making a three dimensional memory device according to an embodiment.

In an embodiment, a surface 102D of the control gate layer 102 directly, physically contacts the blocking dielectric layer 112, as shown in FIGS. 1F and 2.

In an alternative embodiment, the semiconductor channel core 118 may include an inner core of insulating material surrounded by a shell of semiconductor material. In an alternative configuration, the charge storage material 114 may be formed of a multilayer composite, such as an oxide-nitride-oxide (ONO) multilayer, and/or the blocking dielectric 112 may comprise a tri-layer ONO dielectric, such that the memory film comprises ONO (112)-N (114)-O (116).

As illustrated in FIG. 1C, the top layer of insulating material 106 may then be etched to expose openings 122 in a top layer of semiconducting material 124 to form upper select gates 123. In an embodiment, the memory cells 150 are configured with vertical pillar channels 118 and the upper select gates 123 are drain select gates. In this configuration, source select gates 125 are formed at the opposite (substrate) end of the vertical channel, as shown in FIG. 3A. Alternatively, the memory cells 150 are configured with U shaped channels 118 and the select gates include respective drain select gates and source select gates 123, 125 at the upper end of each respective wing portion 118A of the U shaped channel 118, as shown in FIG. 3B. The wing portions 118A are connected by the horizontal channel 118B located in or on the substrate 100.

In an embodiment, a support mask 126 may be deposited over the top layer of insulating material 106 after the openings 122 are formed. The support mask 126 provides support to the memory device after the layers of sacrificial materials 110A and 104 are removed. The support mask 126 may be made of any suitable material, such as an oxide or nitride hard mask material. As shown in FIG. 2, the mask 126 may be a mesh shaped mask which includes clear or open gap portions 126A surrounded by dark or solid cross bar mesh support portions 126B.

In the next step, as illustrated in FIG. 1E, the sacrificial material 110A in the slit trenches 110 may be removed. This removal may be accomplished by selectively etching (e.g., wet etching) the sacrificial material 110A in the trenches 110 through the gaps 126A in the mask 126 without etching the other materials or layers in the device. Removing the material 110A in the trenches 110 exposes the side edges of layers of sacrificial material 104 in the stack.

The layers of sacrificial material 104 may then be removed by selective etching (e.g., wet etching) through the slit trenches 110, as illustrated in FIG. 1F. This results in terraces of exposed control gate 102 material which are supported by the memory cell columns 151. The support mask 126 provides additional support to the memory cell columns 151. The control gates 102 are separated in the vertical direction by the air gaps 104A where the sacrificial material layers 104 were previously located and in the horizontal direction by the slit trenches 110.

After formation of the air gaps 104A, the exposed surfaces of the control gates 102 are silicided to form a silicide layer 128 on the exposed surfaces of the polysilicon control gates 102. The silicide layer 128 may be formed by conformally depositing a thin layer of metal, such as tungsten, cobalt, nickel or titanium, or a combination of two more of these metals, on the exposed control gate polysilicon material and heating the device to react the thin layer of metal with the control gate material. The metal layer may be formed through the gaps 126A in the mask 126 and through the trenches 110 and air gaps 104A. The silicide layer 128 is formed on the upper 102A and lower 102B surfaces of the exposed control gates 102 as well as on the exposed face 102C of the control gate 102 opposite the face 102D that contacts the charge storage region 112 of the memory device 150. The upper and lower surfaces 102A, 102B of the control gates 102 are positioned substantially parallel to the major surface 100A of the substrate 100, while edge surfaces or faces 102C, 102D of the control gate 102 are positioned substantially perpendicular to the major surface 100A of the substrate 100. The silicide layer 128 is also formed on the side wall of the select gates 123, 125 exposed in the trenches 122.

In the completed device, the each memory cell includes a source electrode 130 and a drain electrode 132. Methods of making the source electrode 130 and a drain electrode 132 are described in co-pending U.S. patent application Ser. Nos. 12/827,947 and 13/083,775, hereby incorporated by reference. In a pillar channel configuration shown in FIG. 3A, the drain electrode 130 may be formed at that top of the vertical memory column 151 and the source electrode 132 may be formed in the substrate 100. In a U-shaped channel configuration shown in FIG. 3B, both the source and drain electrodes 132, 130 may be formed contacting the source and drain regions at the top of the wings 118A of the vertical memory column(s) 151.

As illustrated in FIGS. 2 and 4, the control gates 102 in adjacent memory cells 150 in a device level may be connected to each other in a strip 134. The strips 134 connected to a given word line may be combed shaped and strips connected to adjacent word lines may be interdigitated as shown in FIG. 2. As noted above, the strips 134 and individual control gates 102 may be considered portions of the word line rather than discreet elements.

In the embodiment illustrated in FIG. 2, the control gate strips 134 surround a single row of memory cell 150 pillars 151. Alternatively, as illustrated in FIG. 4, each control gate 102 strip 134 may surround two rows of pillars 151 (i.e., wings 118A) of adjacent NAND strings (i.e., memory cells) 150.

In the U-shaped channel configuration of FIG. 3B, the horizontal channel portion 118B of the U-shaped channel 118 connects adjacent channel wing portions 118A under the slit trenches 110, as shown in FIGS. 3B and 4. Thus, the horizontal portion 118B of the U-shaped channel 118 extends substantially perpendicular to the elongation direction of the strips 134 of control gates 102. The drain select gates 123 of adjacent memory cells may be connected to each other via a source line while the source select gates 125 of adjacent memory cells may be connected to each other via a bit line (not shown). While the U-shaped NAND strings 150 are illustrated with the control gate strip 134 surrounding two rows of pillars 151 configuration of FIG. 4, it should be understood that the U-shaped NAND strings 150 may also be used with the control gate strip 134 surrounding one row of pillars 151 configuration of FIG. 2.

FIG. 4 illustrates three control gate strips 134A, 134B and 134C located in the same device level. Control gate strip 134B is located between strips 134A and 134C. Control gate strips 134A and 134C are electrically connected to the same word line WL, while control gate strip 134B is electrically connected to a different word line (not shown), such that strip 134B is interdigitated between strips 134A and 134C in the same device level. The strips 134A, 134B and 134C are separated from each other by air gap trenches 110. A first wing portion 118A of the semiconductor channel 118 of the NAND string 150 (shown by dashed lines) extends through and is surrounded by strip 134C (as well as other strips located above and below strip 134C, such as strip 134D shown in FIG. 1F). The second wing portion 118A of the semiconductor channel 118 extends through and is surrounded by strip 134B (as well as other strips located above and below strip 134B, such as strip 134E shown in FIG. 1F). The connecting portion 118B (shown in dashed lines) of the semiconductor channel 118 is located below the air gap trench 110 which separates the strips.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A completed three dimensional memory device, comprising:
a substrate;
a semiconductor channel, at least one end portion of the semiconductor channel extending substantially perpendicular to a major surface of the substrate;
at least one charge storage region located adjacent to semiconductor channel; and
a plurality of control gate electrodes having a strip shape extending substantially parallel to the major surface of the substrate, wherein the plurality of control gate electrodes comprise at least a first control gate electrode located in a first device level and a second control gate electrode located in a second device level located over the major surface of the substrate and below the first device level;
wherein each of the plurality of control gate electrodes comprises:
a semiconductor material portion consisting essentially of a p-doped or n-doped Group IV semiconductor material; and
a metal silicide portion composed of a metal silicide of the Group IV semiconductor material and at least one metal,
wherein surfaces of the semiconductor material portion are in contact with the metal silicide portion and the at least one charge storage region,
wherein each vertically neighboring pair of control gate electrodes is spaced by a respective air gap that extends parallel to the major surface of the substrate and is in physical contact with substantially horizontal surfaces of an overlying metal silicide portion and an underlying metal silicide portion
wherein a vertically extending volume extending through the plurality of control gate electrodes is adjoined to the air gaps which comprise a plurality of laterally extending volumes located between each vertically neighboring pair of control gate electrodes to provide a contiguous air gap comprising a single undivided space.

2. The device of claim 1, wherein:
a first edge surface of each of the plurality of control gate electrodes comprises an edge surface of the semiconductor material portion which contacts the at least one charge storage region;
a second edge surface, a top surface, and a bottom surface of each of the plurality of control gate electrodes are not in contact with the at least one charge storage region; and
the first edge surface and the second edge surface of the plurality of control gate electrodes are positioned substantially perpendicular to the major surface of the substrate.

3. The device of claim 1, wherein:
the semiconductor channel has a pillar shape having a solid or hollow circular cross section when viewed from above; and
the entire pillar-shaped semiconductor channel and the entire at least one charge storage region extend substantially perpendicular to the major surface of the substrate.

4. The device of claim 1, wherein:
the device comprises a vertical NAND device is located over the substrate;
the electrically conductive layers comprise, or are electrically connected to a respective word line of the vertical NAND device;
the substrate comprises a silicon substrate;
the vertical NAND device comprises an array of monolithic three dimensional NAND strings over the silicon substrate;
at least one memory cell in the first device level of the three dimensional array of NAND strings is located over another memory cell in the second device level of the three dimensional array of NAND strings; and
the silicon substrate contains an integrated circuit comprising a driver circuit for the memory device located thereon.

5. The device of claim 1, wherein the contiguous air gap extends to a region located above a horizontal plane including a topmost surface of the plurality of control gate electrodes.

6. The device of claim 1, further comprising a support mask located above the plurality of control gate electrodes, wherein a top surface of the contiguous air gap is a bottom surface of the support mask.

7. The device of claim 6, wherein the support mask is patterned layer including at least one opening therein.

8. A three dimensional memory device, comprising:
a substrate;
a semiconductor channel, at least one end portion of the semiconductor channel extending substantially perpendicular to a major surface of the substrate;
at least one charge storage region located adjacent to semiconductor channel; and
a plurality of control gate electrodes having a strip shape extending substantially parallel to the major surface of the substrate, wherein the plurality of control gate electrodes comprise at least a first control gate electrode located in a first device level and a second control gate electrode located in a second device level located over the major surface of the substrate and below the first device level;
wherein each of the plurality of control gate electrodes comprises:
a semiconductor material portion composed of a Group IV semiconductor material; and
a metal silicide portion composed of a metal silicide of the Group IV semiconductor material and at least one metal, wherein surfaces of the semiconductor material portion are in contact with the metal silicide portion and the at least one charge storage region,
wherein each vertically neighboring pair of control gate electrodes is spaced by a respective air gap that extends parallel to the major surface of the substrate, and
wherein a vertically extending volume extending through the plurality of control gate electrodes is adjoined to the air gaps to provide a contiguous air gap;
further comprising a support mask located above the plurality of control gate electrodes, wherein a top surface of the contiguous air gap is a bottom surface of the support mask, wherein the support mask is patterned layer including at least one opening therein; and further comprising a plurality of memory cells embedded within the plurality of control gate electrodes, wherein:

a first subset of the plurality of memory cells is located underneath a portion of the support mask; and a second subset of the plurality of memory cells is located underneath the at least one opening in the support mask.

9. The device of claim 8, wherein the contiguous air gap vertically extends up to a horizontal plane including a topmost surface the plurality of memory cells.

10. A three dimensional memory device, comprising:

a substrate;

a semiconductor channel, at least one end portion of the semiconductor channel extending substantially perpendicular to a major surface of the substrate;

at least one charge storage region located adjacent to semiconductor channel; and a plurality of control gate electrodes having a strip share extending substantially parallel to the major surface of the substrate, wherein the plurality of control gate electrodes comprise at least a first control gate electrode located in a first device level and a second control gate electrode located in a second device level located over the major surface of the substrate and below the first device level;

wherein each of the plurality of control gate electrodes comprises:

a semiconductor material portion composed of a Group IV semiconductor material; and a metal silicide portion composed of a metal silicide of the Group IV semiconductor material and at least one metal, wherein surfaces of the semiconductor material portion are in contact with the metal silicide portion and the at least one charge storage region, wherein each vertically neighboring pair of control gate electrodes is spaced by a respective air gap that extends parallel to the major surface of the substrate, and wherein a vertically extending volume extending through the plurality of control gate electrodes is adjoined to the air gaps to provide a contiguous air gap;

further comprising a support mask located above the plurality of control gate electrodes, wherein a top surface of the contiguous air gap is a bottom surface of the support mask, wherein the support mask is patterned layer including at least one opening therein; and wherein:

the contiguous air gap is located within a slit trench extending through the plurality of control gate electrodes; and the at least one opening overlies a region of the slit trench and does not overlie another region of the slit trench.

11. The device of claim 1, wherein sidewalls of the plurality of control gate electrodes are physically exposed to the vertically extending volume.

12. The device of claim 1, further comprising additional air gaps located at a level of an upper select gate that is located above the plurality of control gate electrodes, wherein the additional air gaps are located above a topmost control gate electrode among the plurality of control gate electrodes.

13. The device of claim 12, wherein a portion of the vertically extending volume and the additional air gaps are vertically bounded from above by bottom surfaces of a same support mask.

14. The device of claim 1, further comprising a support mask located above the plurality of control gate electrodes, wherein an upper end portion of the vertically extending volume is bounded by the support mask between a first pair of memory cell columns, and another upper end portion of the vertically extending volume extends through the support mask between a second pair of memory cell columns.

* * * * *